United States Patent [19]

Patel et al.

[11] Patent Number: 5,116,641
[45] Date of Patent: May 26, 1992

[54] METHOD FOR LASER SCRIBING SUBSTRATES

[75] Inventors: Daxesh K. Patel, Hatfield, Pa.; Jay D. Baker, Detroit, Mich.

[73] Assignee: Ford Motor Company, Dearborn, Mich.

[21] Appl. No.: 570,063

[22] Filed: Aug. 20, 1990

[51] Int. Cl.[5] ............................................. C23C 26/00
[52] U.S. Cl. ...................................... 427/96; 427/53.1
[58] Field of Search ................................ 427/96, 53.1

[56] References Cited

U.S. PATENT DOCUMENTS

| | | |
|---|---|---|
| 3,066,033 | 11/1962 | Clark, III . |
| 4,071,639 | 1/1978 | Palmer et al. .................. 427/156 |
| 4,081,653 | 3/1978 | Koo ................................. 427/96 |
| 4,082,830 | 4/1978 | Cogliano ........................ 264/213 |
| 4,288,530 | 9/1981 | Bedard ............................ 427/96 |
| 4,301,194 | 11/1981 | Borja et al. ................... 427/154 |
| 4,352,835 | 10/1982 | Holbrook et al. .............. 427/38 |
| 4,486,738 | 12/1984 | Sadlo et al. ................... 338/320 |
| 4,694,568 | 9/1987 | Morelli et al. .................. 29/620 |
| 4,783,421 | 11/1988 | Carlson et al. .................. 437/4 |
| 4,788,523 | 11/1988 | Robbins .......................... 338/309 |
| 4,931,323 | 6/1990 | Manitt ............................. 427/96 |

FOREIGN PATENT DOCUMENTS 337412 10/1989 European Pat. Off. .
62-40787 7/1987 Japan .
02-250390 10/1990 Japan .

*Primary Examiner*—Shrive Beck
*Assistant Examiner*—Vi Duong Dang
*Attorney, Agent, or Firm*—Lorraine S. Melotik; Roger L. May

[57] ABSTRACT

A method is provided for forming a thick-film circuit having at least one thick-film resistor element upon a substrate and laser scribing the substrate to remove the circuit from the remaining portion of the substrate. A thick-film circuit comprising conductor lines and at least one resistor element is first printed upon a substrate. Thereafter, the resistor element may be laser trimmed to increase the resistance value thereof. After laser trimming, a protective material such as ethyl cellulose is coated onto the outer surface of the resistor element to protect it from hot-slag ceramic material generated during a laser scribing operation. The substrate is then topside laser scribed to separate the thick-film circuit from the remaining portion of the substrate. Following laser scribing, the protective material is removed by washing the resistor element with a solvent.

22 Claims, 3 Drawing Sheets

METHOD FOR LASER SCRIBING SUBSTRATES

BACKGROUND OF THE INVENTION

This invention relates to a method for laser scribinq a substrate and, more particularly, to a method of coating a protective material onto a thick-film resistor element after a laser trimming operation and before a laser scribing operation to protect the resistor element during laser scribing.

It is known in the prior art to make electronic circuit products using a ceramic circuit board. One known process for manufacturing a ceramic circuit board is a thick-film process. This process starts with a ceramic plate as the substrate, such as a fired sintered alumina substrate. Conductor paste is first screen printed onto the substrate and fired to form thick-film conductor lines. Thereafter, a pattern of electrical resistance material is screen printed onto the substrate and fired to form thick-film resistor elements which are connected up to the conductor lines. The conductor lines and resistor elements combine to form a plurality of individual thick-film circuits on the substrate.

After the thick-film resistor elements are formed on the substrate, each may be laser trimmed to increase the resistance value thereof. A laser beam projector is employed which produces a laser beam for evaporating a portion of the resistance material of the resistor element, thereby increasing the resistance value thereof.

After the plurality of thick-film circuits are formed on the substrate, they are separated from one another. A laser beam projector which makes scribes in the substrate has been used in the prior art for separating the individual circuits from one another. It has been found, however, that hot-slag ceramic material generated during laser scribing may recondense onto each surface of one or more of the resistor elements. This recondensed material may result in thermal-mechanical damage to a resistor element which may affect the resistance value thereof.

Attempts have been made in the past to avoid damage to resistor elements during a laser scribing operation. For example, laser scribing from the backside of the substrate away from the thick-film circuits has been attempted in the prior art. Such a method, however, has not been found to be acceptable. This is because mechanical damage to the resistor elements, such as scratches, may occur while the substrate is placed in or taken out of a fixture which holds the substrate during scribing. Further, it is difficult to determine on the underside of the substrate the proper location for making each of the scribes.

A further attempt has been made to avoid damage to resistor elements during a laser scribing operation. This attempt involves coating and firing a glass overglaze onto resistor elements. If a glass overglaze is applied and fired onto thick-film resistors, the resistance value of the resistors may change. As a result, the glass overglaze must be applied before the resistor elements are laser trimmed. Laser trimming speed, however, is drastically reduced if a glass overglaze is on the surface of each of the resistors. Further, since the glass remains permanently on the surface of each of the resistors, visual inspection of the resistors and heat dissipation, particularly of power resistors, is also adversely affected.

Accordingly, a need exists for an improved method of laser scribing a substrate having a thick-film circuit with at least one resistor element formed thereon that is rapid and yet does not damage or alter the resistor during the laser scribing operation.

SUMMARY OF THE INVENTION

This need is met by the present invention, whereby a protective organic polymer coating material such as ethyl cellulose is applied onto a thick-film resistor element on a substrate after a laser trimming step but before a laser scribing step to protect the resistor element from hot-slag substrate material generated during the laser scribing step. The protective coating is then readily removed to permit visual inspection of the resistor element.

In accordance with one aspect of the present invention, a method of laser scribing a substrate having a thick-film circuit formed thereon is provided and comprises the steps of: coating onto an outer surface of at least one portion of the thick-film circuit a protective material to protect the portion from hot-slag substrate material generated during a laser scribing operation; laser scribing the substrate to separate the thick-film circuit from the remainder of the substrate; and, removing the protective material from the outer surface of the at least one portion of the thick-film circuit.

The portion of the thick-film circuit may comprise a thick-film resistor, a dielectric layer or a section of a conductor line. The substrate may comprise an alumina substrate. The protective material coated onto the portion of the thick-film circuit may comprise an organic polymer, such as ethyl cellulose. The ethyl cellulose is preferably applied to the portion before the laser scribing step and is removed from the outer surface of the portion by washing the same with a solvent, such as an alcohol.

The thick-film circuit is formed on a frontside of the substrate and the step of laser scribing the substrate to separate the thick-film circuit from the remainder of the substrate preferably occurs on the frontside of the substrate.

In accordance with a further aspect of the present invention, a method of forming a thick-film circuit having at least one thick-film resistor upon a substrate is provided and comprises the steps of: printing the thick-film circuit having the thick-film resistor onto the substrate; laser trimming the thick-film resistor to increase the resistance value thereof; coating onto the outer surface of the resistor a protective material to protect the resistor from hot-slag substrate material generated during a laser scribing operation; laser scribing the substrate to separate the thick-film circuit from the remainder of the substrate; and, removing the protective material from the outer surface of the resistor.

The step of coating a protective material onto the thick-film resistor occurs subsequent to the laser trimming step. The material coated onto the resistor preferably comprises an organic polymer, such as ethyl cellulose. The ethyl cellulose is removed from the outer surface of the resistor by washing the outer surface with a solvent, such as an alcohol.

The step of printing the thick-film circuit having the thick-film resistor onto the substrate comprises the steps of: printing conductor paste onto the substrate to form conductor lines thereon; and, printing resistor paste onto the substrate to form the thick-film resistor thereon. The thick-film circuit is printed on a frontside of the substrate and the step of laser scribing the substrate to separate the thick-film circuit from the remainder of the substrate preferably occurs on the frontside of the substrate. The substrate may comprise a ceramic material such as alumina.

In accordance with another aspect of the present invention, an intermediate product for use in the production of thick-film circuits is provided and comprises: a substrate; at least two conductor lines formed on the substrate; at least one resistor element formed on the substrate and over a portion of each of the two conductor lines; and a protective material formed over the resistor element to protect the resistor element from hot-slag substrate material generated during a laser scribing operation. The protective material may comprise an organic polymer, such as ethyl cellulose.

Accordingly, it is an object of the present invention to provide a method of laser scribing a substrate having a thick-film circuit with at least one resistor element formed thereon so that the resistor element is not damaged by hot-slag substrate material generated during the laser scribing operation. Other objects and advantages will be apparent from the following description, the accompanying drawing and the appended claims.

DETAILED DESCRIPTION OF THE INVENTION

Figure 1:
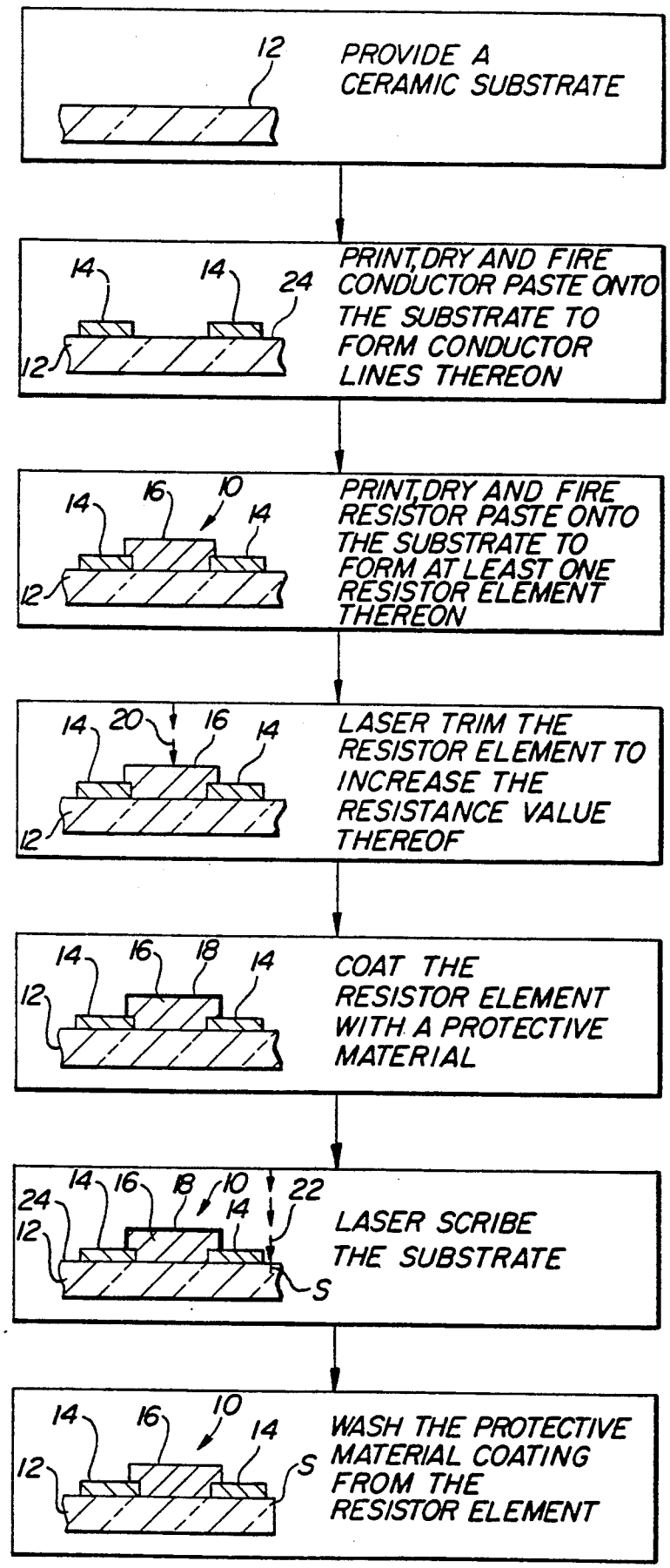
FIG. 1 is a flow diagram illustrating a method according to the present invention for forming a thick-film circuit having at least one thick film resistor upon a substrate and laser scribing the substrate to separate the circuit from the remainder of the substrate.
Figure 2:
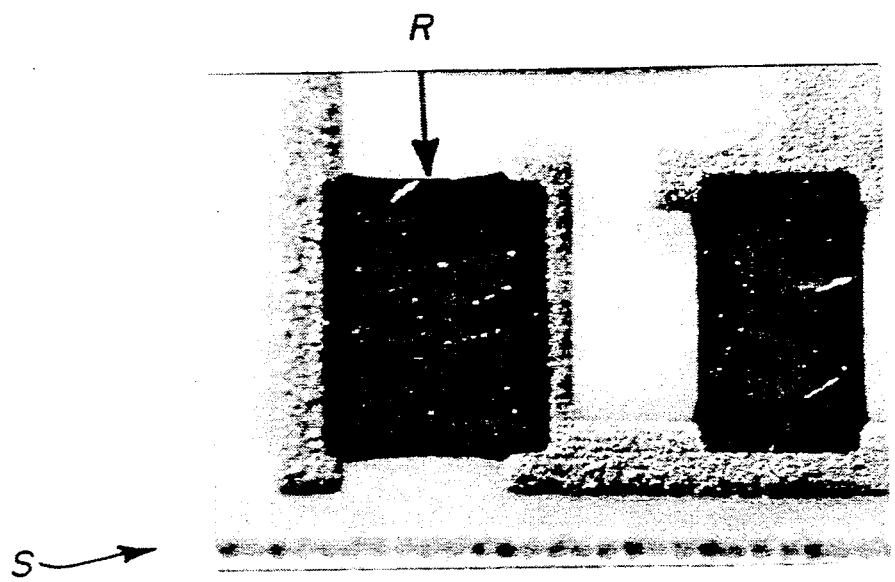
FIG. 2 is an enlarged photograph of a resistor from Group I of resistors tested for a resistance shift after a laser scribing operation.
Figure 3:
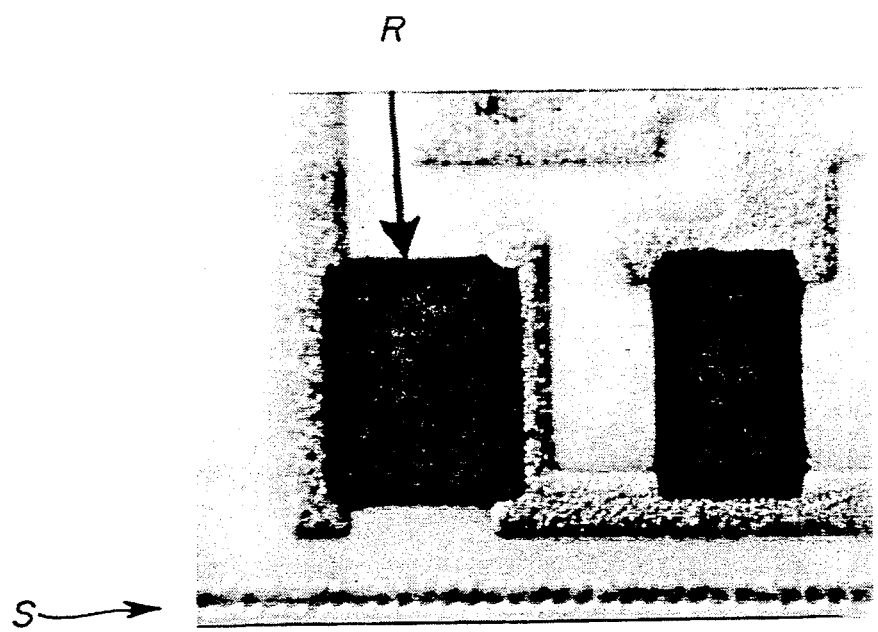
FIG. 3 is an enlarged photograph of a resistor from Group II of resistors tested for a resistance shift after a laser scribing operation.
Figure 4:
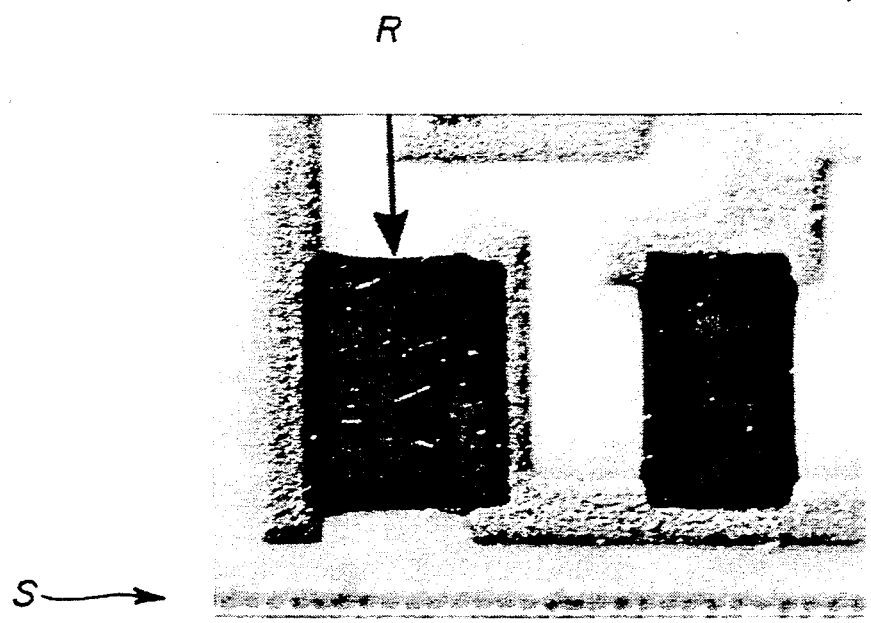
FIG. 4 is an enlarged photograph of a resistor from Group III of resistors tested for a resistance shift after a laser scribing operation; and, FIG. 5 is an enlarged photograph of a resistor from Group IV of resistors tested for a resistance shift after a laser scribing operation.
Figure 5:
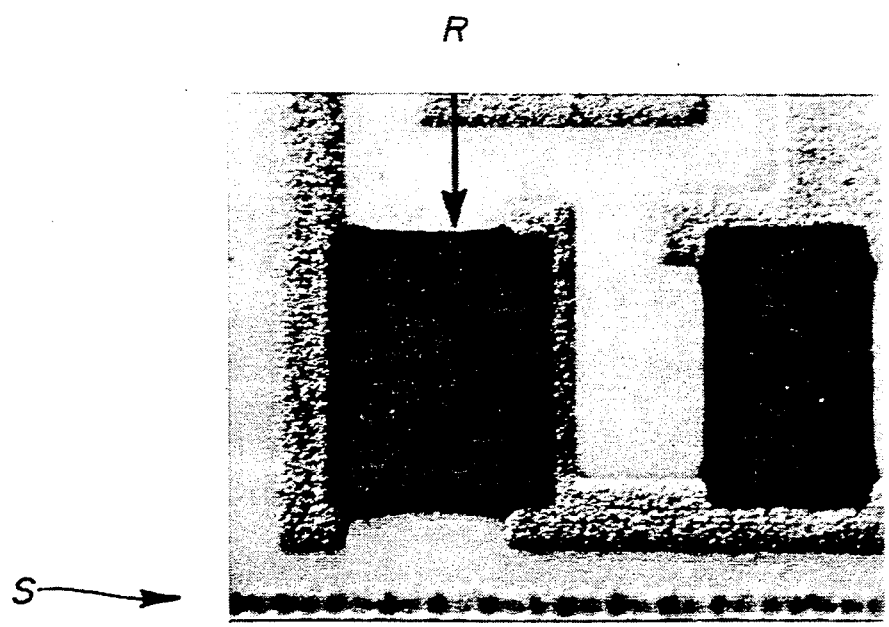

Referring to FIG. 1, there is shown a flow diagram illustrating a method according to the present invention for forming a thick-film circuit 10 having at least one thick-film resistor element 16 upon a substrate 12 and laser scribing the substrate 12 to remove the circuit 10 from the remaining portion of the substrate 12.

As shown in FIG. 1, thick-film conductor lines 14 are formed on the substrate 12. The thick-film resistor element 16 is then formed on the substrate 12 and over a portion of the conductor lines 14. The circuit 10 may include a plurality of conductor lines 14 and one or more resistor elements 16. As can be seen, the substrate 12 is broken away, indicating that multiple thick-film circuits 10 are preferably formed on the substrate 12.

Preferably the substrate 12 is a ceramic substrate such as a fired alumina substrate; although, other substrate materials such as $Si_3N_4$, AlN, and quartz may be used.

The conductor lines 14 may be screen printed onto the substrate 12, and subsequently dried and fired. The material for the conductor lines 14 may be selected from any one of the alloy families of gold, silver, palladium silvers, platinum gold or palladium golds. After the conductor lines 14 are printed onto the substrate 12, they are typically dried for about 20 minutes at 150° C., and subsequently fired through a belt furnace using a 30-60 minute cycle with 8-10 minutes at a peak temperature of 850° C.

The resistor element 16 may be formed next, as shown in FIG. 1, using screen printing techniques. The material used in forming the resistor element 16 may be a resistor paste such as ruthenium dioxide paste. Other resistor materials containing Pd, carbon, or tantalum nitride may also be used. After the resistor element 16 is screen printed onto the substrate, it is dried and subsequently fired in a similar manner to that of the conductor lines 14.

After the resistor element 16 is formed on the substrate 12, it may be laser trimmed in a known manner, as shown in FIG. 1, in order to increase the resistance value thereof. A laser beam projector (not shown) which produces a beam 20 is employed to evaporate a portion of the resistance material of the resistor element 16, thereby increasing the resistance value thereof.

Following the laser trimming step and prior to the laser scribing step, a protective material 18 is coated onto the resistor element 16 and dried. The protective material preferably comprises an organic polymer such as T-type ethyl cellulose which is a 49.6% minimum ethoxyl content cellulose, designated by CAS Abstract #9004-57-3. After coating, the ethyl cellulose coating is preferably dried for 5-10 minutes at a temperature of 150° C. The ethyl cellulose coating serves to protect the resistor element 16 from hot-slag substrate material generated during the laser scribing step by acting as a barrier to any substrate material sputtered onto the element 16.

After the protective coating is applied onto the resistor element 16, an uncoated portion of the substrate 12 is laser scribed by a laser beam projector (not shown) to separate the thick-film circuit 10 from the remaining portion of the substrate 12. Preferably, the substrate is scribed from the topside 24 of the substrate 12. The laser projector produces a beam 22 which creates scribes S or score lines in the substrate, each having a depth equal to approximately one-third the thickness of the substrate 12. After the scribe lines S are formed in the substrate 12, the circuit 10 is then broken away from the remaining portion of the substrate 12. This may be done manually. Preferably, a plurality of thick-film circuits 10 are formed on the substrate 12 and are separated from one another during the laser scribing operation.

After the laser scribing operation, the resistor element 16 is washed to remove from its outer surface the protective material 18 and any substrate material trapped in the protective material 18. If the protective material is ethyl cellulose, a solvent comprising an alcohol may be used to wash the material 18 from the resistor element 16. A further known solvent which is sold under the tradename PRELETE by Dow Chemical Company may alternatively be used to wash the resistor element 16.

The following example is given to illustrate certain preferred details of the invention, it being understood that the details of the example are not to be taken as in any way limiting the invention thereto.

EXAMPLE 1

Four test groups were provided. Each group included 24 thick-film circuits having at least one resistor element formed thereon. Each of the 24 circuits of each group were formed on 24 separate substrates. One resistor element was tested from each circuit in each group to test the resistance shift of the resistor after its respective substrate was laser scribed. Substantially all of the resistance shifts were upward shifts, i.e., the resistance value of the resistor increased.

In group I, the resistor elements were untrimmed and uncoated before laser scribing. In group II, the resistor elements were untrimmed but were coated with ethyl cellulose before laser scribing. In group III, the resistor elements were laser trimmed and uncoated before laser scribing. In Group IV, the resistor elements were laser trimmed and coated with ethyl cellulose before laser scribing. The resistor elements in each group were formed from ruthenium dioxide resistor paste. The untrimmed resistors were 40 KOHM value resistors and the trimmed resistors were 60 KOHM value resistors. The resistor elements were formed upon a 96% alumina substrate. The substrate also included conductor lines thereon formed from silver palladium paste.

Each resistor was tested for resistance shift after laser scribing and after 24 hours of thermal aging at 125° C. The resistance shifts measured from the untrimmed resistors of groups I and II were averaged for each group and compared to the desired value of 40 KOHM. Likewise, the resistance shifts measured from the trimmed resistors of groups III and IV were averaged for each group and compared to the desired value of 60 KOHM.

The results are shown in Table 1 below:

TABLE 1

| Group | Average Resistance Shift After Scribe KOHMS (%) | Average Resistance Shift After 24 Hrs. of Thermal Aging at 125° C. KOHMS (%) |
| --- | --- | --- |
| I | .044 (.11) | .064 (.16) |
| II | <.01 (.03) | .03 (.08) |
| III | .097 (.16) | .139 (.23) |
| IV | .019 (.03) | .054 (.09) |

The coated resistor elements from groups II and IV, measured before thermal aging, had average resistance shifts of <0.01 KOHM and 0.019 KOHM, respectively. The uncoated resistor elements from groups I and III, measured before thermal aging, had average resistance shifts of 0.044 KOHM and 0.097 KOHM, respectively. The coated resistor elements from groups II and IV, measured after 24 hours of thermal aging at 125° C., had average resistance shifts of 0.03 KOHM and 0.054 KOHM, respectively. The uncoated resistor elements from groups I and III, measured after thermal aging, had average resistance shifts of 0.064 KOHM and 0.139 KOHM, respectively. Thus, the average shift in resistance for the coated, untrimmed resistors of group II was less than that of the non-coated, untrimmed resistors of group I, both before and after thermal aging. Further, the average shift in resistance for the coated, trimmed resistors of group IV was less than that of the non-coated, trimmed resistors of group III, both before and after thermal aging.

Surface damage after laser scribing to a resistor element from groups I, II, III, and IV may be seen in FIGS. 2, 3, 4, and 5, respectively. The scribe lines are designated by the letter "S", while the resistors are designated by the letter "R". The straight, white lines on the resistors are scratches caused by hot-slag ceramic material and the white dotted areas are hot-slag ceramic particles. It should be apparent that the non-coated resistor elements from groups I and III, shown in FIGS. 2 and 4, respectively, were damaged significantly more by hot-slag ceramic material than the coated resistors from groups II and IV, shown in FIGS. 3 and 5, respectively.

The results of Example I above lead to the following conclusions:

1) The thick-film untrimmed resistor elements coated with ethyl cellulose prior to laser scribing experienced an average resistance shift significantly less than the untrimmed resistor elements left uncoated during laser scribing, both before and after thermal aging.

2) The thick-film trimmed resistor elements coated with ethyl cellulose prior to laser scribing experienced an average resistance shift significantly less than the trimmed resistor elements left uncoated during laser scribing, both before and after thermal aging.

3) The thick-film resistor elements coated with ethyl cellulose prior to laser scribing experienced substantially no visual surface damage whereas the uncoated resistor elements experienced permanent microscopic surface damage, i.e., scratches.

By the present invention, a method is provided for protecting a resistor element formed on a substrate during a laser scribing operation. The method comprises coating a protective material, preferably ethyl cellulose, onto the resistor element prior to the laser scribing operation to protect the resistor element from hot-slag substrate material generated during the laser scribing operation.

Having described the invention in detail and by reference to preferred embodiments thereof, it will be apparent that modifications and variations are possible without departing from the scope of the invention defined in the appended claims. For example, it is contemplated that an ethyl cellulose coating may be used to protect other sensitive areas on a circuit board, such as sensitive sections of conductor lines, dielectric layers and the like. Further, it is contemplated that an ethyl cellulose coating may be employed to protect resistors or the like on multilayered circuits. It is also contemplated that an ethyl cellulose coating may be employed as an environmental protectant for any circuit element formed or located on a circuit board.

What is claimed is:

1. A method of laser scribing a substrate having a thick-film circuit formed thereon comprising the steps of:

coating onto an outer surface of at least one portion of said thick-film circuit a protective material to protect said portion from hot-slag substrate material generated during a laser scribing operation;

laser scribing an uncoated portion of said substrate to separate said thick-film circuit from the remainder of said substrate; and, removing said protective material from said outer surface of said portion.

2. A method of laser scribing a substrate as set forth in claim 1, wherein said at least one portion comprises at least one thick-film resistor.

3. A method of laser scribing a substrate as set forth in claim 1, wherein said substrate is a ceramic substrate.

4. A method of laser scribing a substrate as set forth in claim 1, wherein said ceramic substrate is an alumina substrate.

5. A method of laser scribing a substrate as set forth in claim 1, wherein said protective material comprises an organic polymer.

6. A method of laser scribing a substrate as set forth in claim 5, wherein said organic polymer comprises ethyl cellulose.

7. A method of laser scribing a substrate as set forth in claim 6, wherein said ethyl cellulose is removed from said outer surface of said portion by washing with a solvent.

8. A method of laser scribing a substrate as set forth in claim 7, wherein said solvent comprises an alcohol.

9. A method of laser scribing a substrate as set forth in claim 1, wherein said protective material is applied to said portion before said laser scribing step.

10. A method of laser scribing a substrate as set forth in claim 1, wherein said thick-film circuit is formed on a topside of said substrate and said step of laser scribing said substrate occurs on the topside of said substrate.

11. A method of laser scribing a substrate as set forth in claim 1, wherein said at least one portion comprises at least one dielectric layer.

12. A method of laser scribing a substrate as set forth in claim 1, wherein said at least one portion comprises at least one section of a conductor line.

13. A method of forming a thick-film circuit having at least one thick-film resistor upon a substrate comprising the steps of:
    printing said thick-film circuit having said at least one thick-film-film resistor onto said substrate;
    laser trimming said at least one thick-film resistor to increase the resistance value thereof;
    coating onto the outer surface of said resistor a protective material to protect said resistor from hot-slag substrate material generated during a laser scribing operation;
    laser scribing an uncoated portion of said substrate to separate said thick-film circuit from the remainder of said substrate; and
    removing said protective material from said outer surface of said resistor.

14. A method of forming a thick-film circuit as set forth in claim 13, wherein said step of coating a protective material onto said thick-film resistor occurs subsequent to said laser trimming step.

15. A method of forming a thick-film circuit as set forth in claim 13, wherein said substrate is a ceramic substrate.

16. A method of forming a thick-film circuit as set forth in claim 5, wherein said ceramic substrate is an alumina substrate.

17. A method of forming a thick-film circuit as set forth in claim 13, wherein said protective material comprises an organic polymer.

18. A method of forming a thick-film circuit as set forth in claim 17, wherein said organic polymer comprises ethyl cellulose.

19. A method of forming a thick-film circuit as set forth in claim 18, wherein said ethyl cellulose is removed from said outer surface of said resistor by washing with a solvent.

20. A method of forming a thick-film circuit as set forth in claim 19, wherein said solvent comprises an alcohol.

21. A method of forming a thick-film circuit as set forth in claim 13, wherein said step of printing said thick-film circuit having at least one thick-film resistor onto said substrate comprises the steps of:
    printing conductor paste onto said substrate to form conductor lines thereon; and,
    printing resistor paste onto said substrate to form said at least one thick-film resistor thereon.

22. A method of laser scribing a substrate as set forth in claim 13, wherein said thick-film circuit is printed on a topside of said substrate and said step of laser scribing said substrate to separate said thick-film circuit from the remainder of said substrate occurs on the topside of said substrate.

* * * * *